United States Patent [19]
Hristake

[11] Patent Number: 5,414,594
[45] Date of Patent: May 9, 1995

[54] SELF-ADJUSTING INSERTION/EXTRACTION APPARATUS FOR PRINTED CIRCUIT BOARDS

[75] Inventor: Val Hristake, Maplewood, N.J.

[73] Assignee: VSI Corporation, Torrance, Calif.

[21] Appl. No.: 166,686

[22] Filed: Dec. 14, 1993

[51] Int. Cl.⁶ .................. H05K 5/00; H05K 7/12; H01R 13/629; H01R 13/635

[52] U.S. Cl. .................. 361/755; 361/754; 361/798; 439/152; 439/153; 439/155; 439/325; 439/328

[58] Field of Search ............. 211/41; 361/607, 609, 361/726, 732, 740, 747, 754, 755, 759, 798, 801; 403/16, 321, 322, 325, 330; 439/152, 153, 155, 157, 325, 327, 328, 331, 345, 629

[56] References Cited

U.S. PATENT DOCUMENTS 5,006,951 4/1991 Albert et al. .................. 361/759

FOREIGN PATENT DOCUMENTS

| | | | |
|---|---|---|---|
| 0587451 | 3/1994 | European Pat. Off. | 361/759 |
| 1-76798 | 3/1989 | Japan | 361/798 |
| 1-268098 | 10/1989 | Japan | 361/758 |
| 4-188794 | 7/1992 | Japan | 361/798 |
| 4-220976 | 8/1992 | Japan | 361/754 |
| 459873 | 2/1975 | U.S.S.R. | 361/752 |
| 1031014 | 7/1983 | U.S.S.R. | 361/759 |

Primary Examiner—Leo P. Picard
Assistant Examiner—Donald A. Sparks
Attorney, Agent, or Firm—Pretty, Schroeder, Brueggemann & Clark

[57] ABSTRACT

A self-adjusting insertion/extraction apparatus is disclosed for inserting and extracting a printed circuit (PC) board into and from an electrical connector mounted at the base of a PC board rack, the apparatus being configured to function effectively regardless of limited variations in the height of the PC board. The apparatus includes a lever and a pawl pivotally secured to the PC board, at an edge of the board opposite the connector. A spring resiliently couples the lever to the pawl such that pivoting the lever from a raised position to a lowered position yieldably biases the pawl into engagement with the PC board rack, to insert the board into the rack connector. Further, raising the lever from its lowered position to its raised position moves a portion of the lever into engagement with the rack, to extract the board from the connector. Limited variations in the height of the board are accommodated by corresponding flexing of the spring. Some embodiments are configured to disengage the spring from the pawl after the PC board has been fully installed, to reduce the remnant load on the rack's back plane.

22 Claims, 7 Drawing Sheets

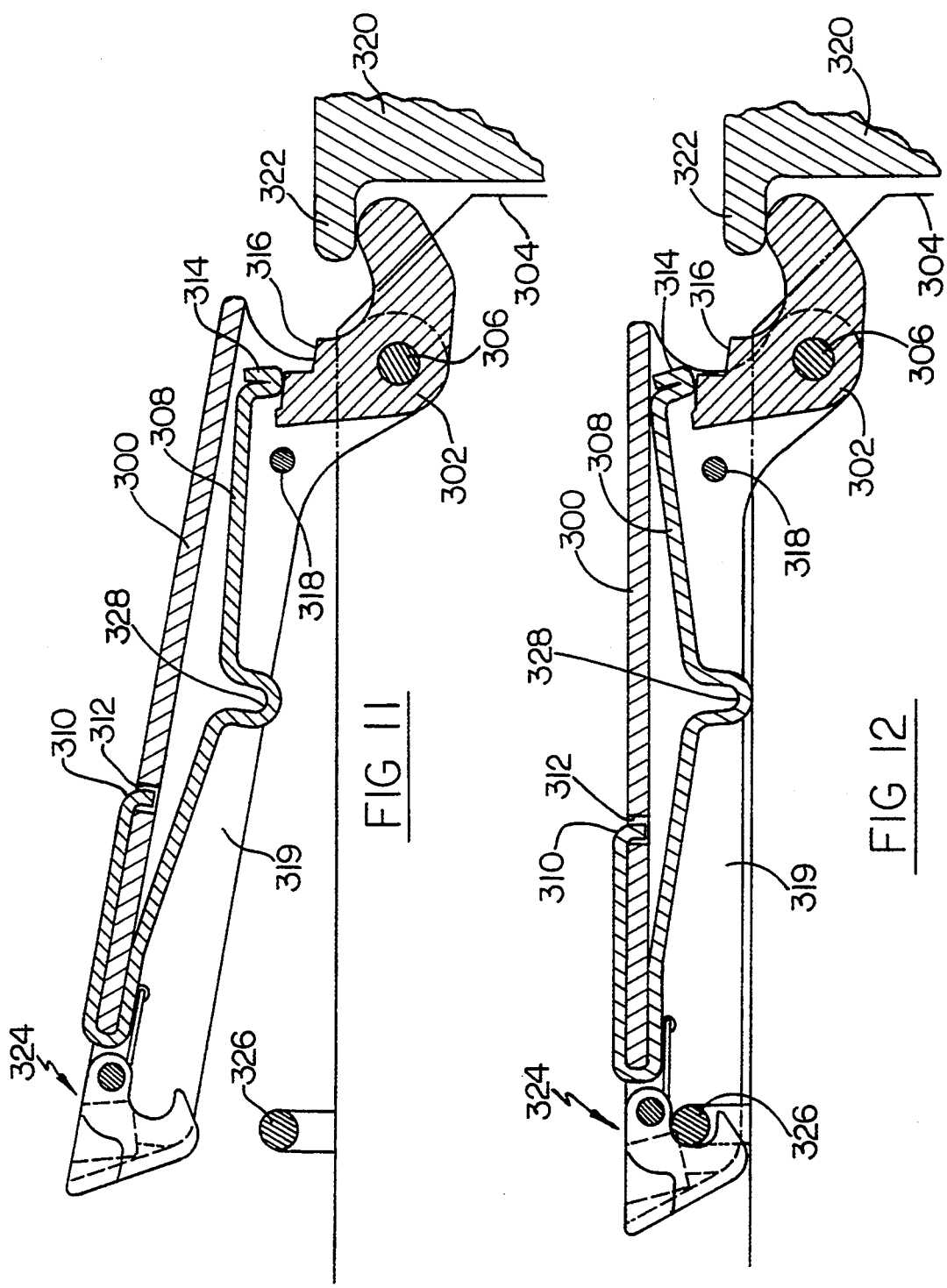

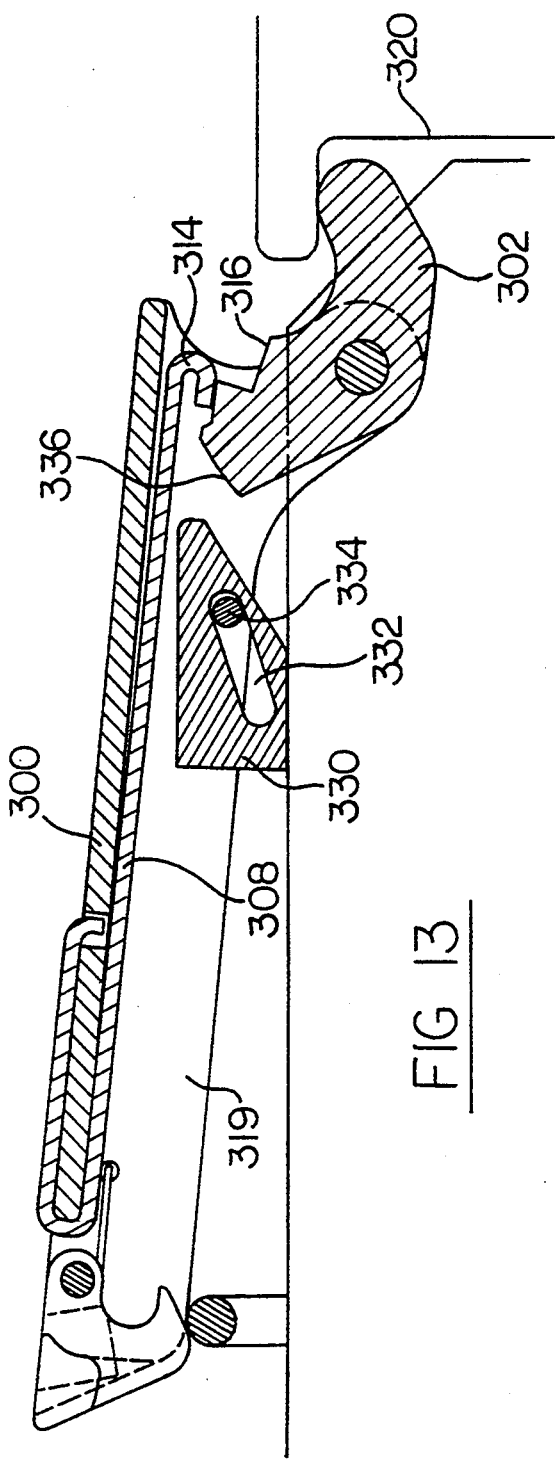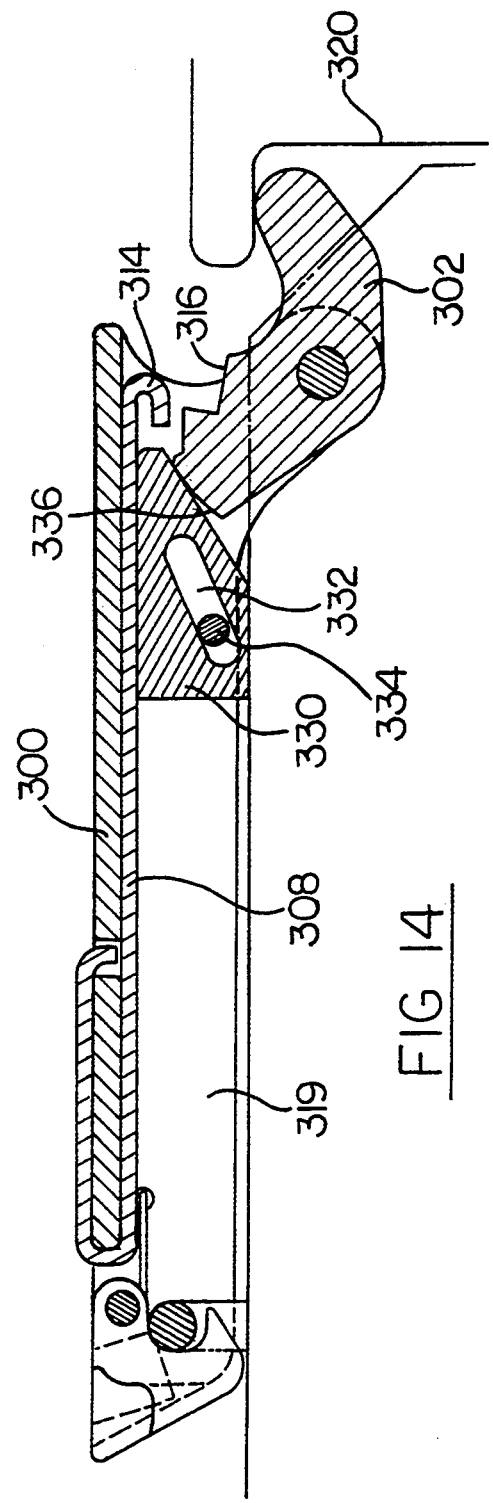

SELF-ADJUSTING INSERTION/EXTRACTION APPARATUS FOR PRINTED CIRCUIT BOARDS

BACKGROUND OF THE INVENTION

This invention relates generally to apparatus for use in inserting and extracting a printed circuit (PC) card into and from an electrical connector mounted at the base of a PC board rack and, more particularly, to apparatus of this kind that are tolerant to height variations of the PC board.

PC boards are commonly used to construct complex electronic systems. Such systems normally include multiple PC boards, with each PC board representing a functional division of the system, permitting easier maintenance and troubleshooting. Multiple electrical connections are normally required for each PC board. It is not unusual to require 80 or more such connections per PC board. Clearly, individual wires between PC boards would be undesirable. Thus, a multi-pin electrical connector is commonly used, permitting all of the required connections to be made simultaneously by inserting the edge of the PC board into the connector.

One common example of a connector is an edge connector that mates to fingers on an edge of the PC board. These fingers typically are uniformly-spaced, gold-plated contacts on the front and back sides of a lower mating edge of the PC board. Inputs and outputs of electrical circuitry on the PC board are interconnected to these fingers. When the PC board is being inserted into the edge connector, the board initially encounters a considerable resistance force against its lower mating edge, as high as 100 pounds or more. The magnitude of this resistance force will vary with the size of a PC board, the number of connections, and the design of the particular edge connector. As the PC board is further inserted, this resistance force is transformed into a retention force that instead compresses the fingers on both sides of the PC board. Consequently, when the PC board is fully inserted, the mechanical and electrical connections will be maintained by this retention force.

This retention force might not always be sufficient to keep the PC board fully inserted. Specifically, some systems in their normal usage are subjected to shock and vibration that can displace the PC board. In some cases, this force can actually be sufficient to eject the PC board from the edge connector. If this occurs, the circuitry on the PC board will no longer be connected to the remainder of the system and a catastrophic system failure might occur.

Thus, it is desirable to have an apparatus that provides mechanical assistance for inserting or extracting a PC board into or from a PC board rack, as well as for maintaining the retention force so that shock and vibration can be withstood. Prior attempts to address these desires have not proven to be entirely satisfactory.

FIG. 1 shows one prior device of this kind. A PC board rack 20 is shown having a connector 22 mounted at its base. The PC board rack provides slots (not shown), for guiding the insertion of a PC board 24, and a stable base with leverage contact points for insertion and extraction mechanisms. These mechanisms include two levers 26 and 28 mounted at opposite upper corners of the PC board.

The levers 26 and 28 interact with the PC board rack 20 in two ways. First, when it is desired to insert the PC board 24, the board is slid into the rack until the board's edge connector 29 abuts the rack connector 22. The two levers are then manually pivoted downwardly. This presses pawl portions of the levers against the underside of ledges 30 and 32 that are part of the rack, to generate a downward insertion force on the PC card and thereby to urge the board into the edge connector. To withstand potential shock and vibration, secondary locks 34 and 36 latch the outer ends of the respective levers 26 and 28 when pivoted to their downward positions. Second, when it is desired to extract the PC board from the rack, the levers are manually pivoted upwardly into contact with the upper sides of the ledges 30 and 32. This generates an extraction force against the rack, allowing the board to be easily removed from the rack.

The PC board insertion/extraction apparatus shown in FIG. 1 generally operates satisfactorily only when the height of the PC board 24 is within a tolerance range that permits the levers 26 and 28 to be latched by the secondary locks 34 and 36. If the PC board is too tall, the levers cannot be pivoted fully downwardly into engagement with the secondary locks. This position of the levers is shown by the reference numbers 26A and 28A in FIG. 1. If the PC board is too short, on the other hand, the levers can be pivoted beyond the secondary locks, thus providing a gap between the levers and the secondary locks and preventing a full insertion of the PC board. This position of the levers is shown by the reference numbers 26B and 28B in FIG. 1.

It should therefore be appreciated that a need exists for a PC board insertion/extraction apparatus that can function properly to insert and extract a PC board to and from a PC board rack despite limited height variations in the PC board. The present invention satisfies this need.

SUMMARY OF THE INVENTION

Briefly, and in general terms, the present invention is embodied in an apparatus used for inserting and extracting a printed circuit (PC) board into and from an electrical connector at the base of a PC board rack, the apparatus functioning effectively despite limited height variations of the PC board. The apparatus includes a lever and a pawl pivotally secured to the PC board at the edge of the board opposite the connector, and further includes a spring for resiliently coupling the lever to the pawl such that pivoting the lever from a raised position to a lowered position yieldably biases the pawl into engagement with the rack, to insert the board into the electrical connector. Further, pivoting the lever from the lowered position to the raised position moves the lever into engagement with the rack, to extract the board from the connector. The lever is freely movable between its raised and lowered positions regardless of limited variations in the height of the PC board, with such variations being accommodated by flexing of the spring.

In a more detailed feature of the invention, the lever and pawl are pivotally secured to a corner of the PC board using a common pin and a corresponding apparatus is symmetrically mounted on an opposite corner of the PC board. Further, in one embodiment, the spring is a leaf spring having a first portion secured to the lever and a second portion that is engaged by a roller that is part of the pawl. In an alternative embodiment, the spring is a column spring having a first end secured to the lever and a second end with a built-in roller positioned to engage the pawl. In both embodiments, the spring is configured to deflect by a variable amount, to account for limited variations in the height of the PC board when the PC board is inserted into the electrical connector.

In other more detailed features of the invention, the apparatus further includes a second spring secured to the lever, for yieldingly biasing the lever to its raised position. Further, a secondary lock is provided for releasable locking the lever in its lowered position. This secondary lock can include a catch movable between a retracted position in which it is spaced from the lever and an extended position in which it engages the lever. Spring-biasing means biases the catch to its extended position.

In some embodiments of the invention, one end of the spring is configured as a nub sized to be received in a corresponding recess formed in the pawl. When the lever is in its raised position, the spring biases the nub into the pawl recess, whereby the lever and the pawl are movable together as a unit. Pivoting the lever in the first direction, past a position at which the printed circuit board has been inserted into the connector, causes the nub to step out of the recess, against the yielding bias of the spring. This substantially reduces the spring force biasing the pawl against the printed circuit board rack, but nevertheless prevents the pawl from disengagement with the rack.

These latter embodiments of the invention can further include bias relief means engageable with the printed circuit board when the lever has been pivoted to the lowered position. This urges the nub away from the pawl and thereby further reduces the spring biasing the pawl against the printed circuit board rack. This bias relief means can include a middle portion of the spring bent into a U-shaped projection engageable with the printed circuit board. Alternatively, the bias relief means can include a wedge mounted for limited movement on the lever between the spring and the printed circuit board when the lever is in the lowered position.

Other features and advantages of the present invention should become apparent from the following description of the preferred embodiment, taken in conjunction with the accompanying drawings, which illustrate, by way of example, the principles of the invention.

BRIEF DESCRIPTION OF THE DRAWINGS

FIG. 11 is a side sectional view of the insertion/extraction apparatus of FIG. 10, in a position where the printed circuit board has been fully inserted into the rack connector and further pivoting of the pawl has been inhibited and where the spring nub has been disengaged from the pawl recess.

FIG. 12 is a side sectional view of the insertion/extraction apparatus of FIG. 10, in the lowered position, with the secondary lock engaged.

FIG. 13 is a side sectional view of a fifth embodiment of an insertion/extraction apparatus in accordance with the invention, in a position where the printed circuit board has been fully inserted into the rack connector and further pivoting of the pawl has been inhibited and where the spring nub has been disengaged from the pawl recess.

FIG. 14 is a side sectional view of the insertion/extraction apparatus of FIG. 13, in the lowered position, with the secondary lock engaged.

DESCRIPTION OF THE PREFERRED EMBODIMENTS

Figure 1:
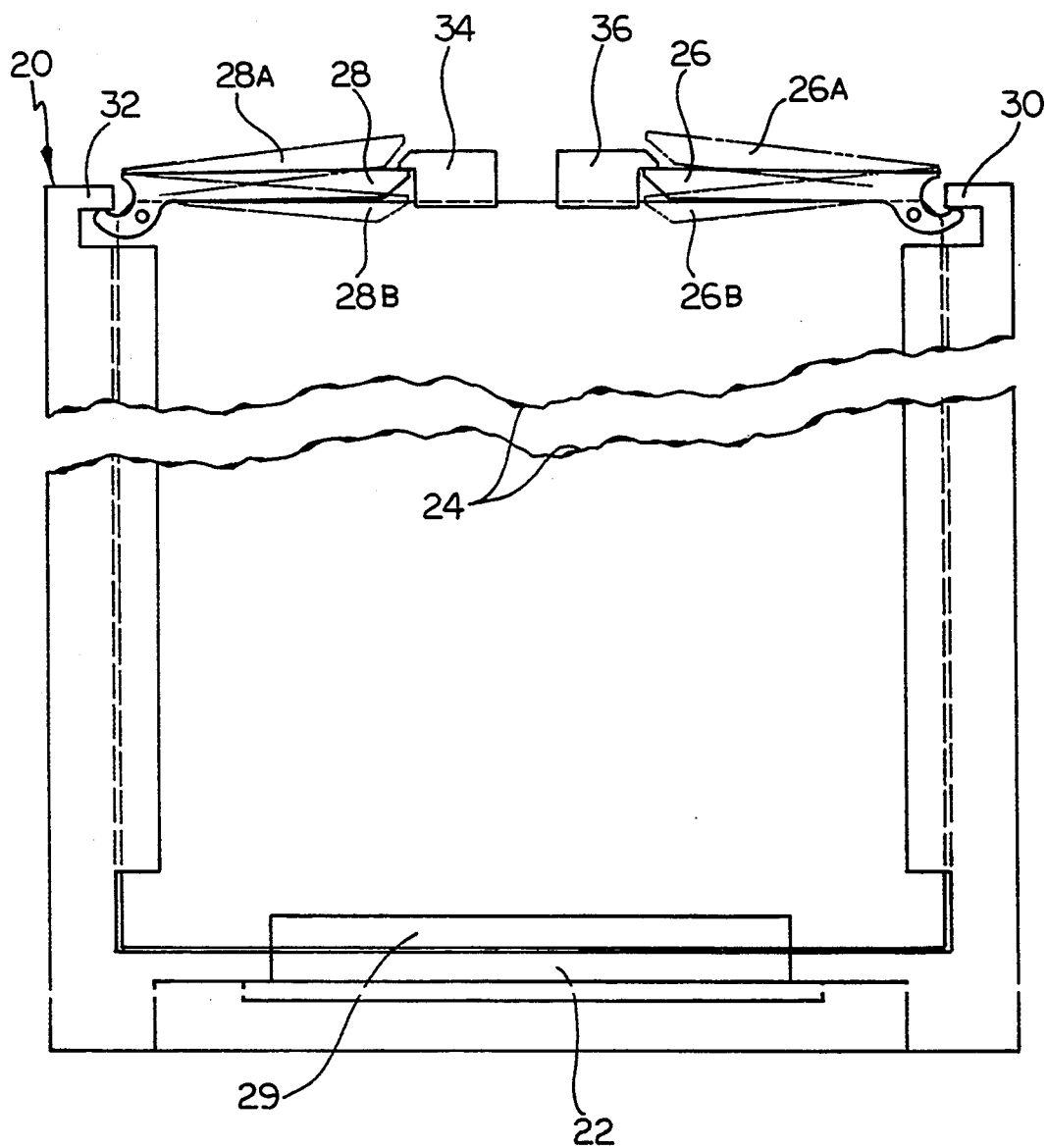
FIG. 1 is a diagrammatic view of printed circuit board having a prior art apparatus for inserting and extracting the board into and from a printed circuit board rack.

With reference now to the drawings, and particularly to FIGS. 2–5, there is shown by way of example a first embodiment of an apparatus for use in inserting and extracting a printed circuit (PC) board 40 into and from a PC board rack 42. This engages and disengages a multi-terminal electrical connector (not shown) mounted at a lower edge of the PC board. The apparatus includes a lever 44 and a pawl 46 pivotally connected to an upper corner of a heat sink 47 that is part of the PC board via a common pivot pin 48 whose axis is perpendicular to the plane of the PC board. A leaf spring 50 yieldably biases the pawl to pivot with the lever about the pivot pin. A similar apparatus (not shown) is secured to the PC board's opposite upper corner. For simplicity of discussion, however, only one such apparatus is described.

To install the PC board 40 into the PC board rack 42, the board is placed into a slot in the rack with the lever 44 pivoted upwardly to a raised position. The rack slot is oriented such that the PC board's lower edge is positioned immediately above the multi-terminal connector (not shown) at a lower portion of the rack. Pivoting the lever downwardly about the pivot pin 48 yieldably biases the pawl 46 into engagement with the underside of a ledge 52 that is part of the rack. This applies a downward force to the PC board, via the pivot pin, to urge the board into engagement with the connector. After the lever has been pivoted fully downwardly to a lowered position (as depicted in FIG. 2), a secondary lock 54 is engaged, to lock the PC board in place.

To extract the PC board 40 from the PC board rack 42, the secondary lock 54 is manually released, as will be described below, and the lever 44 then is pivoted upwardly toward its raised position. The rightmost end of the lever thereupon engages the upper side of the rack's ledge 52, so as to provide an upward force to the PC board via the pivot pin 48. This extracts the board from the rack's connector.

The lever 44 takes the form of an inverted channel having a middle section 56 and two flanks 58a and 58b. The pivot pin 48 extends between the two flanks, near one end of the lever. The leaf spring 50 includes a U-shaped attachment section 60 that slides over the lever's middle section 56, at its end nearest the pivot pin, where it is held in place by a finger 62 that projects into a small hole 64 in the lever's middle section. A depending arch section 66 of the leaf spring arches away from the lever's middle section, between the two flanks 58a and 58b. This arch section is engaged by a roller 68 that is secured by a pin 70 to an end of the pawl 46 opposite the end that engages the ledge 52 of the PC board rack 42. A pin 72 extending between the two flanks 58a and 58b of the lever 44 confines the pawl and ensures that the pawl remains continuously engaged with the arch section 66 of the leaf spring 50, whereby the pawl is constrained to pivot with the lever about the pivot pin 48.

Figure 2:
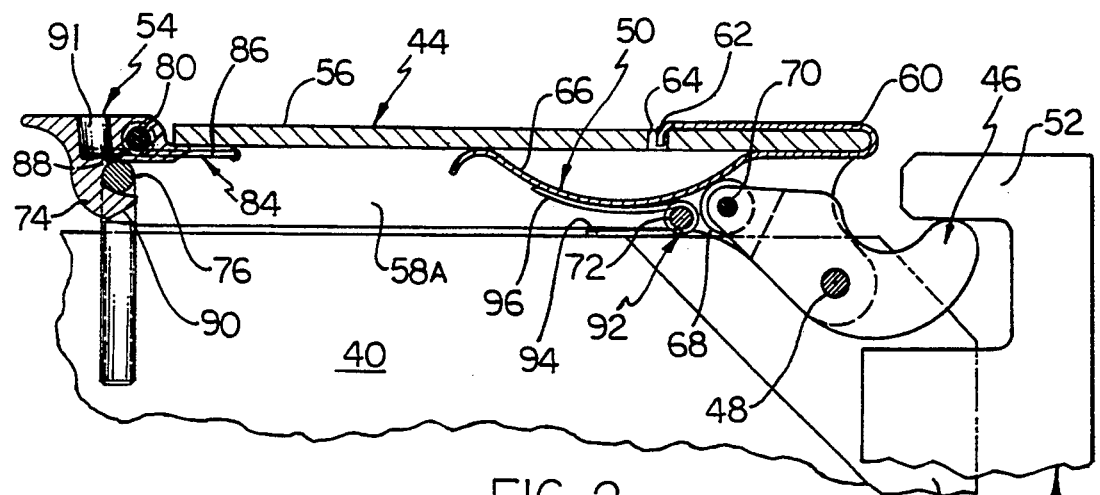
FIG. 2 is a side sectional view of one embodiment of an insertion/extraction apparatus in accordance with the invention.
Figure 3:
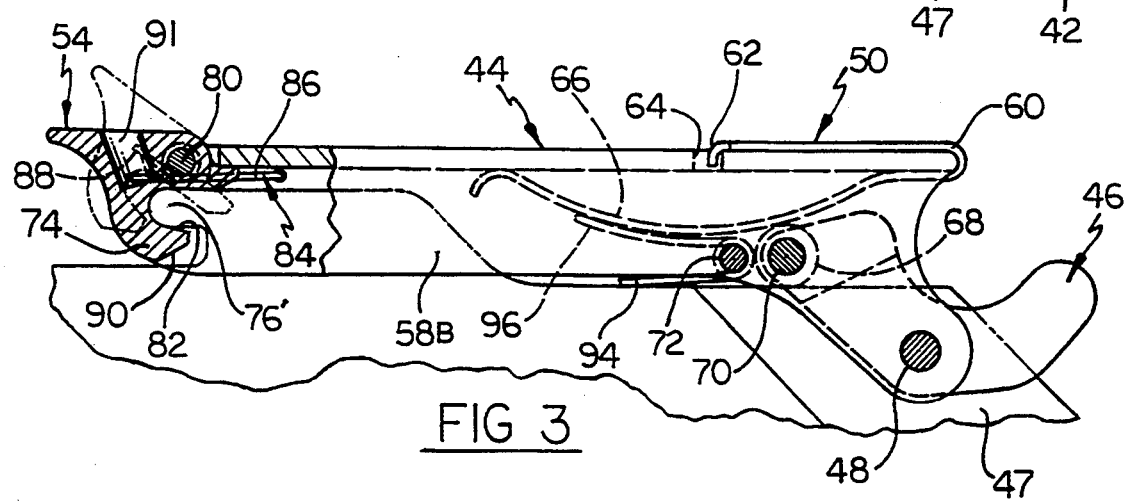
FIG. 3 is a side view of an insertion/extraction apparatus like that of FIG. 2, but having a secondary lock shown to be engageable with a specially configured protuberance rather than a locking pin.
Figure 4:
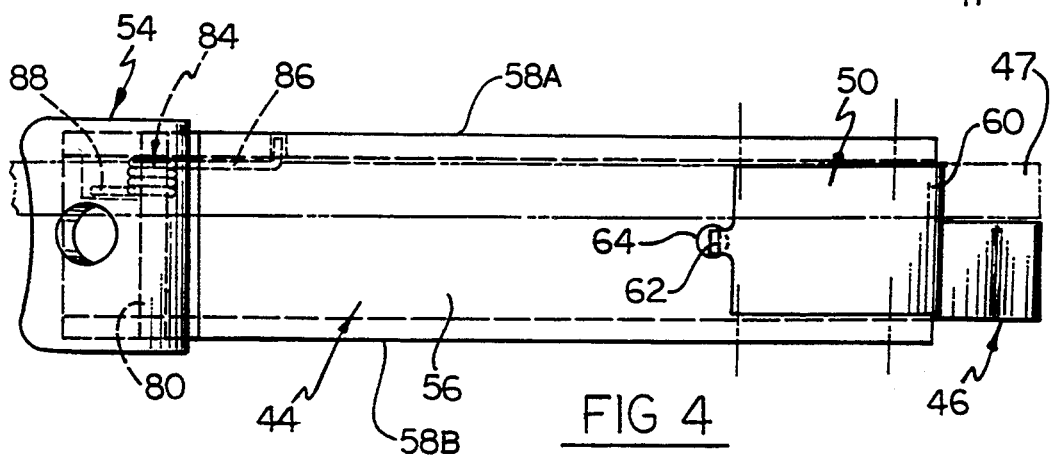
FIG. 4 is a top plan view of the insertion/extraction apparatus of FIG. 2.
Figure 5:
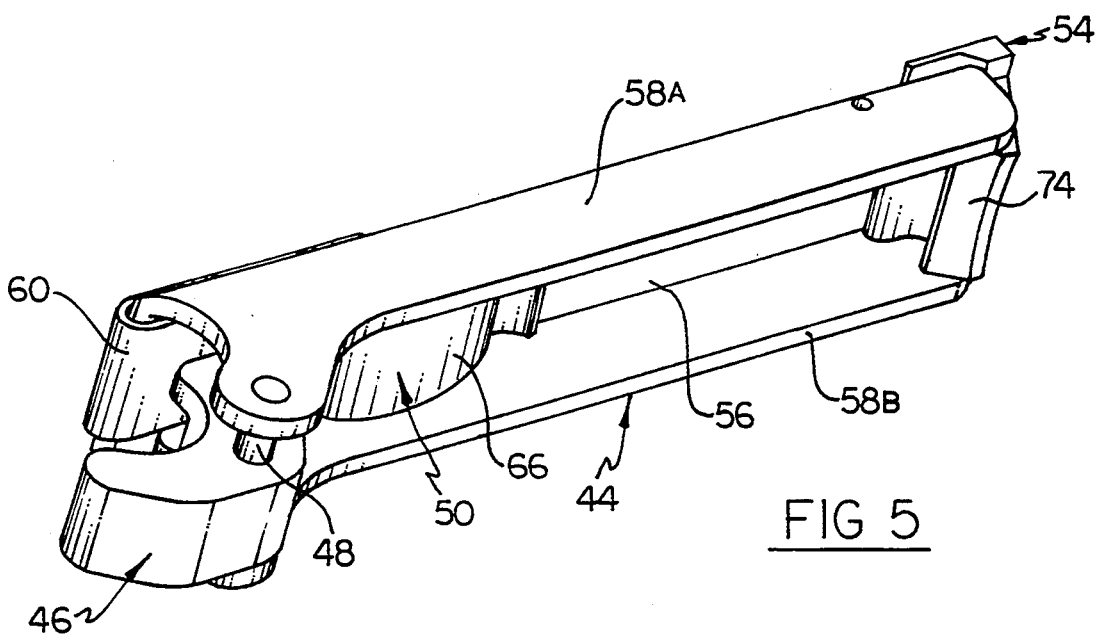
FIG. 5 is a perspective view of the underside of the insertion/extraction apparatus of FIG. 2.

The insertion/extraction apparatus of FIGS. 2 and 3 is adapted to function effectively even if the height of the PC board 40 deviates from a nominal value. This advantageous result is achieved because of the special resilient coupling between the lever 44 and the pawl 46. In particular, different heights in the PC board are accommodated by appropriate amounts of flexing by the leaf spring 50.

For example, if a PC board 40 that is shorter than a nominal height is fully installed, the lever 44 will be pivoted fully downwardly and held in that place by the secondary lock 54, while the pawl 46 is pivoted further relative to the lever. This additional rotation of the pawl (counterclockwise in FIG. 2) is provided by the bias of the leaf spring 50.

Conversely, if a PC board 40 that is taller than a nominal height is fully installed, the lever 44 again will be pivoted fully downwardly and retained in place by the secondary lock 54, but the pawl 46 will be pivoted by an amount less than the lever, which corresponds to the PC board's deviation from the nominal height. The reduced pivoting is taken up by the leaf spring 50. A PC board having the maximum allowable height will cause the leaf spring to be fully compressed.

As previously mentioned, the secondary lock 54 engages and locks the remote end of the lever 44 when the lever has been pivoted fully downwardly. The secondary lock includes a catch 74 pivotally secured to the lever's remote end and a locking pin 76 (FIG. 2) secured to the heat sink 47 at the PC board's upper end. FIG. 3 depicts a modified configuration, in which a rounded protuberance 76' is substituted for the locking pin 76 of FIG. 2. The protuberance 76' is integral to the heat sink 47, and it is used when the heat sink's thickness or composition prevents an effective insertion of a locking pin into the heat sink. The catch pivots on a pivot pin 80 that extends between the lever's flanks 58a and 58b, and it includes a recess 82 sized to receive the locking pin 76 (or the protuberance 76'). The locking pin projects upwardly from the heat sink and is bent 90° to a position where it can be engaged by the catch recess 82.

A torsion spring 84 encircles the pivot pin 80, with opposite ends of the spring including fingers 86 and 88 that engage the lever 44 and the underside of the catch 74, to pivotally bias the catch to a lowered position. This position is shown in solid lines in FIG. 3. Manually pulling on the catch pivots the catch upwardly, against the bias of the torsion spring. This upward position is shown by the dotted lines in FIG. 3. Manually releasing the catch allows the torsion spring to return the catch to its lowered position.

A cam surface 90 on the underside of the catch 74 causes the catch to pivot upwardly and automatically engage the locking pin 76 when the lever 44 is manually pivoted downwardly into contact with the locking pin. In this manner, the apparatus can function automatically to insert the PC board 40 in the rack connector, and to lock the board in place, merely by pivoting the lever downwardly. Alternatively, the catch can be manually pivoted upwardly to facilitate disengagement from the pin 76 by inserting a rod (not shown) into a hole 91 in the catch's upper side and by then pivoting the rod to the right. The rod conveniently can be an Allen wrench.

To bias the lever 44 upwardly and away from the PC board 40, the apparatus further includes a second torsion spring 92 that encircles the pin 72 used to confine the pawl. Opposite ends of the spring 92 constitute fingers 94 and 96 that project outwardly from the pin 72. One finger 94 engages the PC board's upper edge, while the other finger 96 engages the underside of the arch section 66 of the leaf spring 50.

Figure 6:
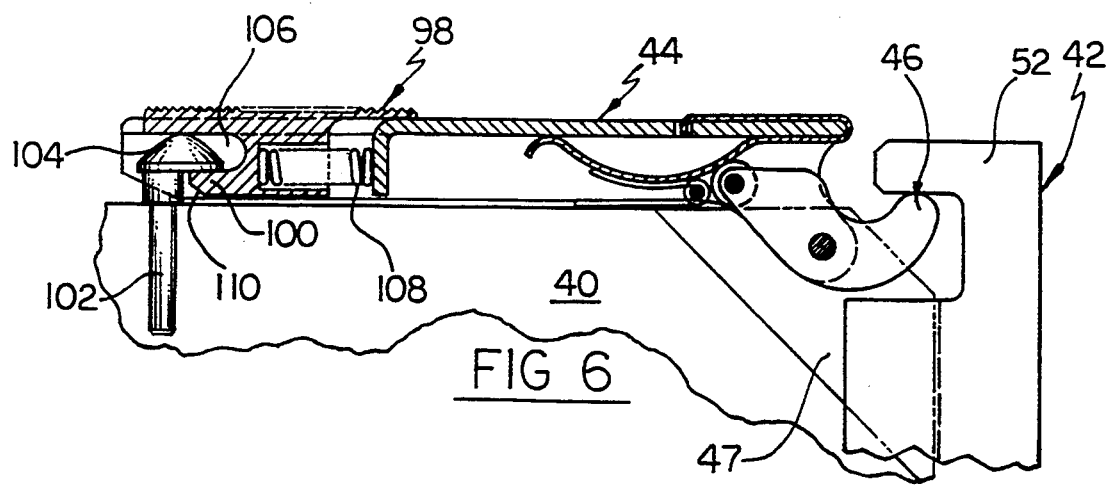
FIG. 6 is a side sectional view of a insertion/extraction apparatus having a modified secondary lock.

With reference now to FIG. 6, there is shown an alternative configuration for a secondary lock 98. This secondary lock operates by linear motion of a catch 100 rather than by pivoting motion, as in the secondary lock 54 of FIGS. 2–5. In particular, the catch 100 is secured to the lever's remote end and configured to slide axially along the lever 44. A locking pin 102 projects upwardly from the heat sink 47 of the PC board 40 and terminates in a button 104 sized to be received in a recess 106 formed in the catch. A compression spring 108 biases the catch to an extended position, where the catch recess receives and captures the button.

Manually pushing the catch 100 toward the lever's pivot axis, against the bias of the compression spring 108, retracts the catch and releases the catch recess 106 from the button 104. This allows the lever then to be pivoted upwardly to remove the PC board 40 from the PC board rack 42. A textured surface on the upperside of the catch facilitates the catch's manual retraction. A cam surface 110 on the underside of the catch 100 causes the catch to retract when the lever is manually pushed downwardly, whereby the catch recess can automatically engage the button 104.

Figure 7:
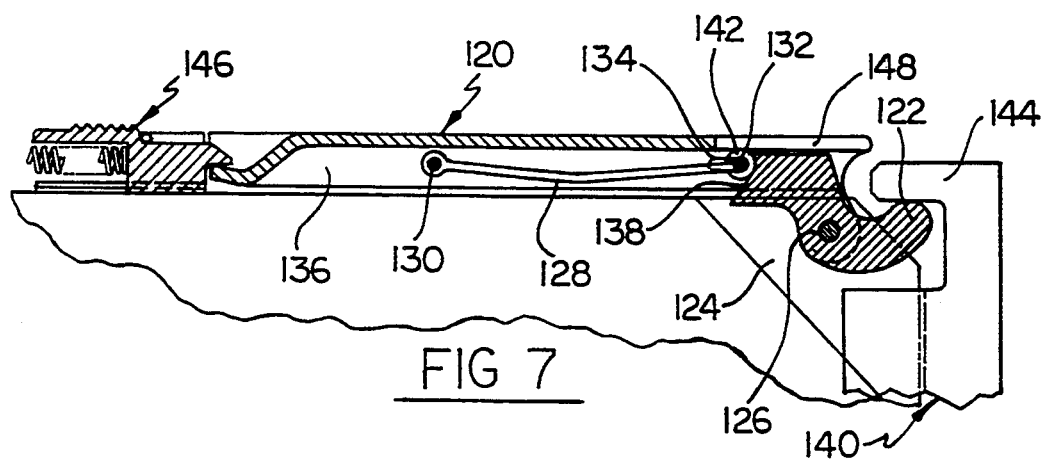
FIG. 7 is a side sectional view of a second embodiment of an insertion/extraction apparatus in accordance with the invention.

FIG. 7 depicts a second embodiment of a self-adjusting insertion/extraction apparatus incorporating the invention. The depicted apparatus includes a lever 120 and a pawl 122 pivotally connected to an upper corner of a PC board heat sink 124 via a common pivot pin 126 whose axis is perpendicular to the plane of the PC board. In contrast with the apparatus of FIGS. 2–6, however, this apparatus includes a column spring 128 for yieldably biasing the pawl to pivot with the lever about the pivot pin.

More particularly, both ends of the column spring 128 are secured to the lever 120. One end is fixably secured by a pin 130, while the other end is slidably secured by a pin 132 that is free to slide along narrow slots 134 formed in the lever's flanks 136. The spring is configured such that its sliding end is biased toward the far end of the slot, into engagement with a cam surface 138 on the pawl 122.

In use, to install the PC board 124 into a PC board rack 140, the lever 120 is initially pivoted upwardly to its raised position and the board is placed into the slot of the rack. Pivoting the lever downwardly about the pivot pin 126 moves roller 142 at the sliding end of the column spring 128 into engagement with the pawl cam surface 138, to yieldably bias the pawl to rotate with the lever. Eventually, the pawl will engage the underside of a ledge 144 that is part of the rack. When the lever has reached its lowered position, as depicted in FIG. 7, a secondary lock 146 will secure it in place.

If the PC board 124 is undersized, the pawl 122 will pivot a corresponding amount more than does the lever 120, with the additional pivoting being provided by the bias of the column spring. Conversely, if the PC board is oversized, the pawl will pivot by a corresponding amount less than does the lever, such that the pin 132 and roller 142 move leftwardly within the slot 134 and the column spring 128 undergoes additional compression. An opening 148 in the lever 120 accommodates any degree of pivoting of the pawl that differs from that of the lever.

Figure 8:
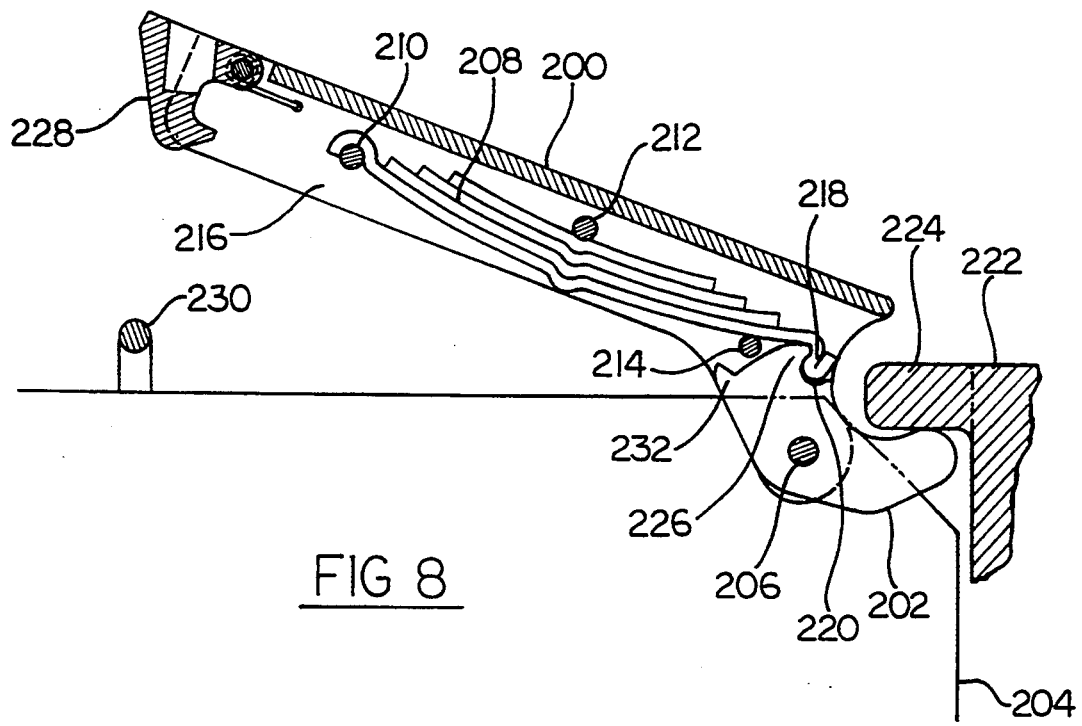
FIG. 8 is a side sectional view of a third embodiment of an insertion/extraction apparatus in accordance with the invention.

FIG. 8 depicts a third embodiment of self-adjusting insertion/extraction apparatus incorporating the invention. The apparatus includes a lever 200 and a pawl 202 pivotably connected to an upper corner of a PC board heat sink 204 via a common pivot pin 206, oriented perpendicular to the plane of the heat sink. In contrast with the previously described embodiments, this embodiment includes a multi-leaf spring 208 confined between three pins 210, 212 and 214 that extend between two flanks of the lever, one of which is shown and identified by the reference numeral 216. The leaf-spring is positioned in a pre-loaded condition, with its two ends above the pins 210 and 214 and with its middle below the pin 212. The end of the leaf spring closest to the pivot pin 206 is formed into a nub 218, which is received in a correspondingly shaped recess 220 formed in the pawl 202. With the nub so positioned in the recess, the lever and pawl can pivot together as a unit about the pivot pin 206.

In use, the lever 200 is pivoted to its fully raised position (i.e., vertical) and the PC board is slid into the rack, a portion of which is identified by the reference numeral 222, until the PC board connector (not shown) contacts the rack's mating connector (not shown). The lever is then pivoted downwardly about the pivot pin 206, with the pawl 202 constrained to move with the lever by engagement of leaf spring nub 218 with the pawl recess 220. The tip of the pawl thereupon will be brought into contact with the bottom surface of a ledge 224 that is part of the rack. Further pivoting of the lever creates an insertion force equal to or greater than the friction force of the connector pair, whereupon the connector pair become fully seated. Further pivoting of the pawl is thereafter precluded.

Figure 9:
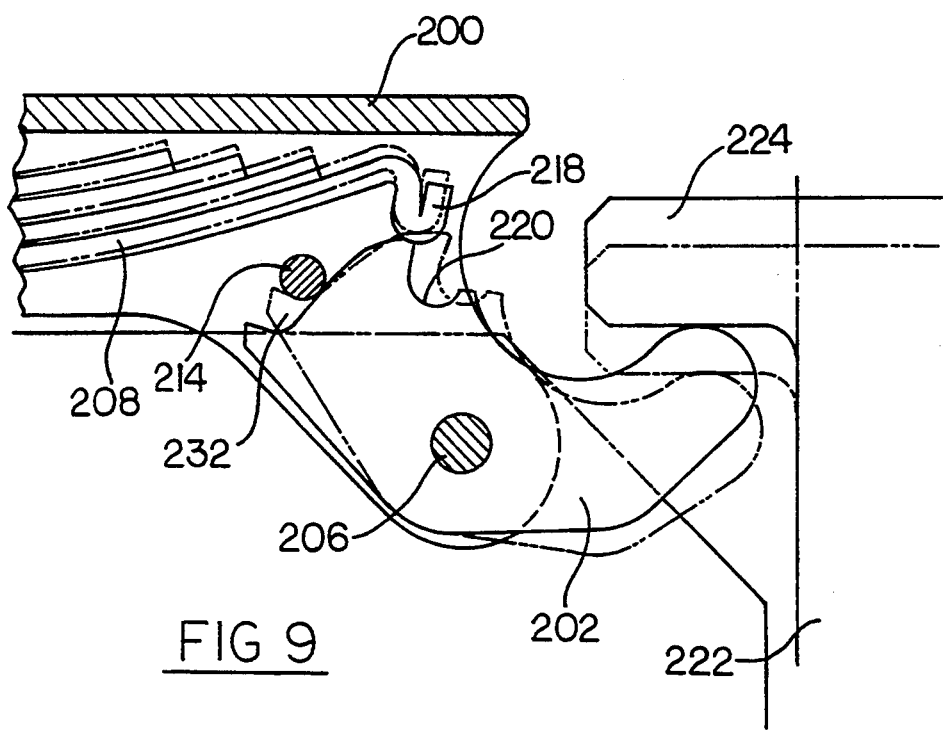
FIG. 9 is an enlarged, fragmentary view of a portion of the insertion/extraction apparatus of FIG. 8, showing the final position of the pawl and spring for two different sizes of printed circuit boards.

Still further downward pivoting of the lever 200 is made against the yielding bias of the leaf spring 208, as the leaf spring's nub 218 is caused to ride up and out of the pawl recess 220. This nub disengagement is depicted in FIG. 9. The nub then rides on a cam surface 226 formed on the pawl's upper side. The angle of contact between the spring nub and the pawl recess is selected so that a predetermined connector insertion force must be attained before the nub can be stepped out of the recess and onto the pawl's cam.

After the lever 200 has been pivoted downwardly to be parallel with the upper edge of the PC board's heat sink 204, a secondary lock 228 engages a locking pin 230, to lock the lever in place. This secondary lock functions in the same manner as described above, with reference to the first and second embodiments.

It will be appreciated that the inserter/extractor apparatus of FIGS. 8–9 can accommodate limited variations in the PC board's height by changing the angular position of the nub 218 of the leaf spring 208 on the cam surface 226 of the pawl 202. For PC boards at the short end of an allowable range, the nub will be positioned immediately adjacent to the recess 220, as depicted by the solid lines in FIG. 9. For PC boards at the long end of the allowable range, on the other hand, the hub will be positioned at the other end of the cam, as depicted by the broken lines in FIG. 9. A finger 232 projects from the cam to engage the pin 214 and thus prevent further relative movement of the lever relative to the pawl.

The insertion/extraction apparatus of FIGS. 8–9 provides a secondary benefit of sharply reducing the remnant load of the PC board onto the back plane of the rack 22. The back plane is the rack's lower surface on which the rack connectors are mounted. This makes that load substantially independent of the heights of the installed PC boards.

Figure 10:
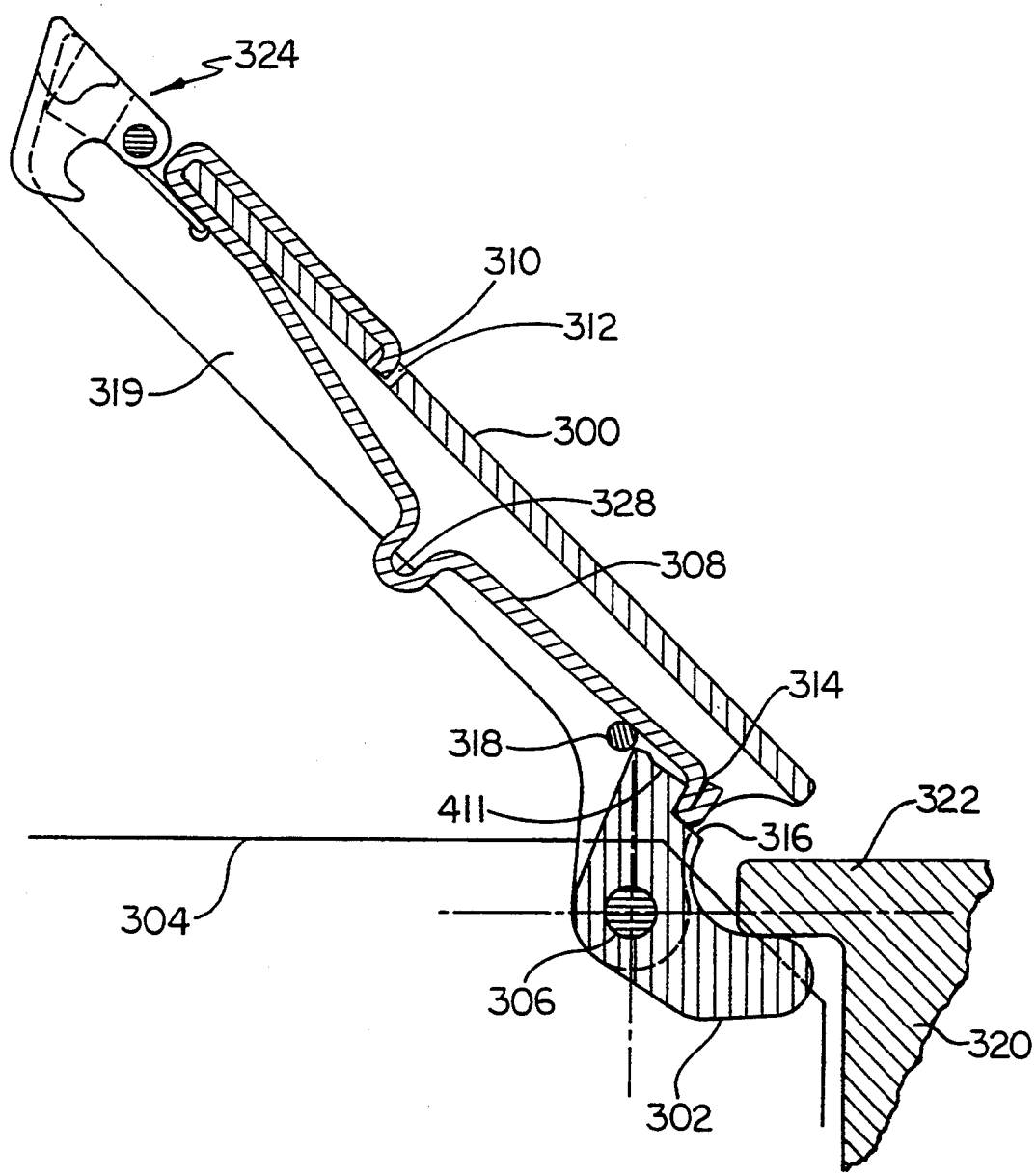
FIG. 10 is a side sectional view of a fourth embodiment of an insertion/extraction apparatus in accordance with the invention, in a position where the pawl first engages the printed circuit board rack.

FIGS. 10–12 depict a fourth embodiment of a self-adjusting insertion/extraction apparatus incorporating the invention. The apparatus includes a lever 300 and a pawl 302 pivotably connected to an upper corner of a PC board heat sink 304 via a common pivot pin 306, oriented perpendicular to the plane of the heat sink. A leaf spring 308 is secured to the end of the lever opposite the pivot pin, by being bent over itself to form a clip. A tab 310 engages a hole 312 formed in the lever's upper side, to captivate the spring to the lever. The end of the spring nearest the pivot pin 306 is bent downwardly into a U-shaped nub 314, which is received in a correspondingly-shaped recess 316 formed in the pawl 302. A pin 318 extending between two flanks 319 of the lever 300 engages the underside of the spring, adjacent to the nub, to hold the spring in a pre-loaded position.

In use, the lever 300 is pivoted to its raised, vertical position, and the PC board is slid into a PC board rack 320 until the PC board's connector (not shown) contacts the rack's mating connector (not shown). Pivoting the lever downwardly about the pivot pin 306 brings the tip of the pawl 302 into contact with the bottom surface of a ledge 322 that is part of the rack. Further downward pivoting of the lever forces the connector pair into full engagement. Thereafter, since further downward movement of the PC board and further pivoting of the pawl about the pivot pin 306 are prevented, further pivoting of the lever causes the nub 314 of the spring 308 to step up and out of the pawl recess 316. This position is depicted in FIG. 11.

At the end of the lever's downward pivoting, just before a secondary lock 324 engages a locking pin 326 (FIGS. 11–12), a downward, U-shaped projection 328 in the middle of the spring 308 engages the top of the heat sink 304. This urges the spring upwardly and moves the spring's nub out of contact with the pawl 302, as shown in FIG. 12. This substantially reduces any remnant load imposed by the PC board on the back plane of the rack 320, as described above with reference to the embodiment of FIGS. 8–9. The PC board thereafter is held in place by the friction force provided by the connector pair and by the action of any wedge lock fasteners or the like that might be used along the edges of the PC board heat sink 304.

A fifth embodiment of an insertion/extraction apparatus incorporating the invention is shown in FIGS.

13-14. This embodiment is similar to the embodiment of FIGS. 10-12, and corresponding components and features are identified by the same reference numerals. One significant difference between this embodiment and the embodiment of FIGS. 10-12 is that the middle portion of the spring 308 is straight and a wedge 330 is movably secured to the lever 300 beneath the spring. The wedge includes a slot 332 through which a pin 334 extends, to secure the wedge between the two flanks 319 of the lever.

When the lever 300 is in its raised position, and the nub 314 of the spring 308 is seated in the recess 316 of the pawl 302, the wedge 330 is in its lowermost position, hanging freely on the pin 334. As the lever is pivoted downwardly, to install its associated PC board in the PC board rack 320, the nub will step out of the recess in the same manner as described above with respect to the embodiment of FIGS. 10-12. Shortly after this has occurred, the wedge will be moved into contact with the PC board's upper edge, so as to limit any further downward movement of the wedge. Still further downward pivoting of the lever will cause the wedge to move rightwardly between the lever's flanks and eventually engage both the underside of the spring 308 and a cam surface 336 on the pawl. This lifts the spring nub away from the pawl, to relieve downward pressure on the pawl, and also prevents the pawl from pivoting in any direction (see FIG. 14). This feature is useful in circumstances where no remnant force is allowable on the back plane of the printed circuit rack. In those circumstances, a supplementary mechanism of some kind, such as a conventional wedge lock fastener, must be used to prevent dislodgement of the PC board from the rack.

It should be appreciated from the foregoing description that the present invention provides an improved apparatus for inserting and extracting a PC board into and from a PC board rack, the apparatus functioning effectively regardless of limited variations in the height of the board. The apparatus includes a lever and a pawl pivotally secured to the board, and manual pivoting of the lever is coupled via a leaf spring to the pawl, to insert the PC board, with height variations in the board being taken up by corresponding flexing of the spring. Some embodiments are configured to disengage the spring from the pawl after the PC board has been fully installed, to reduce the remnant load on the rack's back plane.

Although the invention has been described in detail with reference only to the presently-preferred embodiment, those of ordinary skill in the art will appreciate that various modifications can be made without departing from the invention. Accordingly, the invention is defined only by the following claims.

I claim:

1. An insertion/extraction apparatus for a printed circuit board configured to make electrical connections with a connector mounted at the base of a printed circuit board rack, comprising:
    a pawl pivotally secured to the printed circuit board;
    a lever pivotally secured to the printed circuit board and movable between a raised position and a lowered position; and
    a spring for resiliently coupling the lever to the pawl such that pivoting the lever in a first direction, from the raised position to the lowered position, yieldably biases the pawl into engagement with the printed circuit board rack, to insert the printed circuit board into the connector, and such that pivoting the lever in a second direction, from the lowered position to the raised position, moves the lever into engagement with the printed circuit board rack, to extract the printed circuit board from the connector.

2. An insertion/extraction apparatus as defined in claim 1, and further comprising a secondary lock for releasably locking the lever in its lowered position.

3. An insertion/extraction apparatus as defined in claim 2, wherein the secondary lock includes:
    a catch movable between a retracted position in which it is spaced from the lever and an extended position in which it engages the lever; and
    spring-biasing means for biasing the catch to its extended position.

4. An insertion/extraction apparatus as defined in claim 1, and further comprising a pin for pivotally securing both the pawl and the lever to an upper corner of the printed circuit board.

5. An insertion/extraction apparatus as defined in claim 1, wherein:
    the spring is a leaf spring having a first portion secured to the lever and further having a second portion; and
    the pawl includes a roller positioned to engage the second portion of the spring.

6. An insertion/extraction apparatus as defined in claim 1, wherein:
    the spring is a column spring having a first end secured to the lever and having a second end constrained for limited movement relative to the lever;
    the apparatus further comprises a roller secured to the second end of the column spring and positioned to engage the pawl.

7. An insertion/extraction apparatus as in claim 6, further comprising:
    a slot formed in the lever; and
    a pin sized to be received within the slot of the lever, for securing the second end of the column spring.

8. An insertion/extraction apparatus as in claim 1, wherein the spring is configured to deflect by a variable amount when the printed circuit board is inserted into the connector, to account for limited variations in the size of the printed circuit board.

9. An insertion/extraction apparatus as defined in claim 1, and further comprising a second spring secured to the lever, for yieldably biasing the lever to its raised position.

10. An insertion/extraction apparatus as defined in claim 1, wherein:
    the spring is a leaf spring having a first portion secured to the lever and a second portion configured as a nub;
    the pawl includes a recess configured to receive the nub of the spring;
    the spring is configured such that, when the lever is in its raised position, the spring biases the nub into the pawl recess, whereby the lever and the pawl are movable together as a unit; and
    the nub and the pawl recess are configured such that pivoting the lever in the first direction past a position at which the printed circuit board has been fully inserted into the connector causes the nub to step out of the recess, against the yielding bias of the spring.

11. An insertion/extraction apparatus as defined in claim 10, wherein the spring and the pawl are configured such that, when the nub has stepped out of the pawl recess, the spring's biasing of the pawl against the printed circuit board rack is substantially reduced.

12. An insertion/extraction apparatus as defined in claim 10, and further including bias relief means engageable with the printed circuit board when the lever has been pivoted to the lowered position, for urging the nub away from the pawl, and thereby substantially reducing the spring's biasing of the pawl against the printed circuit board rack.

13. An insertion/extraction apparatus as defined in claim 12, wherein the bias relief means includes a middle portion of the spring bent into a U-shaped projection engageable with the printed circuit board.

14. An insertion/extraction apparatus as defined in claim 12, wherein the bias relief means includes a wedge mounted for movement on the lever and interposed between the spring and the printed circuit board when the lever is in the lowered position.

15. An insertion/extraction apparatus for a printed circuit board configured to make electrical connections with a connector mounted at the base of a printed circuit board rack, comprising:
   a pawl pivotally secured to the printed circuit board, at an upper corner of the board;
   a lever pivotally secured at the upper corner of the printed circuit board in common with the pawl and movable between a raised position and a lowered position; and
   spring-biasing means for resiliently coupling the lever to the pawl such that pivoting the lever in a first direction, from the raised position to the lowered position, yieldably biases the pawl into engagement with the printed circuit board rack, to insert the printed circuit board into the connector, and such that pivoting the lever in a second direction, from the lowered position to the raised position, moves the lever into engagement with the printed circuit board rack, to extract the printed circuit board from the connector.

16. An insertion/extraction apparatus for a printed circuit board configured to make electrical connections with a connector mounted at the base of a printed circuit board rack, comprising:
   a pawl pivotally secured to the printed circuit board and including a recess;
   a lever pivotally secured to the printed circuit board and movable between a raised position and a lowered position; and
   a leaf spring having a first portion secured to the lever and a second portion configured as a hub engageable with the pawl, the spring resiliently coupling the lever to the pawl such that pivoting the lever from the raised position toward the lowered position yieldably biases the pawl to pivot into engagement with the printed circuit board rack, to insert the printed circuit board into the connector, whereupon further pivoting of the pawl relative to the printed circuit board is prevented, and such that further pivoting of the lever toward the lowered position causes the nub to step out of the pawl recess, to substantially reduce the biasing of the pawl against the printed circuit board rack.

17. An insertion/extraction apparatus as defined in claim 16, wherein the lever is configured such that pivoting the lever from the lowered position to the raised position moves the lever into engagement with the printed circuit board rack, to extract the printed circuit board from the connector.

18. An insertion/extraction apparatus as defined in claim 16, and further comprising a pin for pivotally securing both the pawl and the lever to an upper corner of the printed circuit board.

19. An insertion/extraction apparatus as defined in claim 16, wherein the spring is configured to deflect by a variable amount when the printed circuit board is inserted into the connector, to account for limited variations in the size of the printed circuit board.

20. An insertion/extraction apparatus as defined in claim 16, and further including bias relief means engageable with the printed circuit board when the lever has been pivoted to the lowered position, for urging the nub away from the pawl, and thereby substantially reducing the spring's biasing of the pawl against the printed circuit board rack.

21. An insertion/extraction apparatus as defined in claim 20, wherein the bias relief means includes a middle portion of the spring bent into a U-shaped projection engageable with the printed circuit board.

22. An insertion/extraction apparatus as defined in claim 20, wherein the bias relief means includes a wedge mounted for movement on the lever and interposed between the spring and the printed circuit board when the lever is in the lowered position.

* * * * *